(12) United States Patent
Takeichi et al.

(10) Patent No.: US 6,641,928 B2
(45) Date of Patent: Nov. 4, 2003

(54) ADHESIVES AND ELECTRIC DEVICES

(75) Inventors: Motohide Takeichi, Kanuma (JP); Misao Konishi, Kanuma (JP); Junji Shinozaki, Kanuma (JP); Yasushi Akutsu, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/971,040

(22) Filed: Oct. 5, 2001

(65) Prior Publication Data
US 2002/0062918 A1 May 30, 2002

(30) Foreign Application Priority Data
Oct. 6, 2000 (JP) ......................................... 2000-306973

(51) Int. Cl.$^7$ ............................................... B32B 15/08
(52) U.S. Cl. ...................... 428/626; 428/620; 523/457; 523/458; 523/459
(58) Field of Search ................................ 428/620, 626; 523/457, 458, 459

(56) References Cited

U.S. PATENT DOCUMENTS 5,278,259 A * 1/1994 Futakuchi ................... 525/482
6,475,641 B2 * 11/2002 Shinozaki ................... 428/626

OTHER PUBLICATIONS

Japanese Industrial Standard, JIS K 7244–4: 1999, "Plastics—Determination of dynamic mechanical properties—Part 4: Tensile vibration—Non–resonance method".
International Standard ISO 6721–4, Nov. 1, 1994, "Plastics—Determination of dynamic mechanical properties—Part 4: Tensile vibration—Non–resonance method".

\* cited by examiner

*Primary Examiner*—Robert Dawson
*Assistant Examiner*—D. Aylward
(74) *Attorney, Agent, or Firm*—Oliff & Berridge, PLC

(57) ABSTRACT

An adhesive for semiconductor chips contains a first resin component which is polymerizable, a first hardener for inducing a self-polymerization reaction of the first resin component and a second hardener which is addition-polymerized with the first resin component. When the adhesive is applied on a wiring board and a semiconductor chip is applied thereon and heat is applied, the second hardener is addition-polymerized with the backbone of the three-dimensional network formed by the self-polymerization reaction of the first resin component. The first temperature at which the addition polymerization zone becomes a rubbery structure is lower than the second temperature at which the backbone becomes a rubbery structure, so that the elastic modulus loss sharply increases at the first temperature to reduce the stress between the semiconductor chip and the wiring board.

11 Claims, 3 Drawing Sheets

ADHESIVES AND ELECTRIC DEVICES

FIELD OF THE INVENTION

The present invention relates to adhesives, and particularly adhesives for connecting a semiconductor chip to a wiring board.

PRIOR ART

Adhesives based on a thermosetting or thermoplastic resin have been used to bond a semiconductor element onto a wiring board.

FIG. 4 shows that a semiconductor chip 111 is applied on a wiring board 113 via an adhesive 112, and bump-like terminals 121 on the semiconductor chip 111 are in contact with terminals 122 formed of parts of the wiring pattern on the wiring board 113. In this state, electric components in the semiconductor chip 111 are electrically connected to the wiring pattern on the wiring board 113 via the terminals 121, 122.

However, the adhesive 112 has a linear expansion coefficient of 25–60 ppm/° C., which is higher than that of the semiconductor chip of about 3 ppm/° C., leading to residual stress at the bonding interface due to the difference of the linear expansion coefficient. Especially, the residual stress increases with the chip size at the periphery of the semiconductor chip, which causes the problem that semiconductor chip 111 may be separated during temperature cycle tests or pressure cooker tests after the thermosetting adhesive 112 is cured.

Moreover, adhesives of the prior art show a marked deterioration of reliability under some moisture adsorption conditions after the semiconductor chip 111 has been bonded, which required a dehydration process by preheating to about 100° C. before the assembly is passed through a reflow furnace to cure the adhesive 112 after the semiconductor chip 111 is applied.

The present invention was made to overcome the disadvantages of the prior art described above with the purpose of providing a highly reliable adhesive.

SUMMARY OF THE INVENTION

The present invention provides an adhesive for connecting a semiconductor chip and a wiring board, comprising a first resin component which is polymerizable, a first hardener for inducing a self-polymerization reaction of the first resin component, and a second hardener which is addition-polymerized with the first resin component.

The present invention provides the adhesive having an elastic modulus decreasing with a temperature increase after curing, wherein the elastic modulus loss sharply increases at both of a first temperature higher than 30° C. and lower than 150° C. and a second temperature within a range of 130° C. or more and 250° C. or less and higher than the first temperature. The difference between the first temperature and the second temperature is preferably 40° C. or more.

The present invention provide the adhesive wherein a ratio of an elastic modulus at the first temperature to an elastic modulus at the second temperature is 2.8 or more. The present invention provides the adhesive wherein the first resin component is an epoxy resin. The adhesive may also contain (1) conductive particles, (2) filler and/or (3) a second resin component which is polymerized separately from the first resin component.

The present invention further provides the adhesive wherein the first hardener is one or more of an imidazole, a tertiary amine or a Lewis acid catalyst and the second hardener is one or more of an active hydrogen-containing amine, a phenol, a hydrazide, a mercapto or a dicyandiamide hardener. The present invention provides the adhesive wherein the adhesive further contains a filler of silica, alumina or titanium oxide.

The adhesive may be preliminarily semicured and formed in the form of a sheet.

The present invention provide an electric device comprising a semiconductor chip and a wiring board, wherein the semiconductor chip is adhesively bonded to the wiring board with the adhesive.

The present invention provides the electric device wherein the semiconductor chip includes connection terminals that contact connection terminals of a wiring pattern on the wiring board.

Figure 1A:
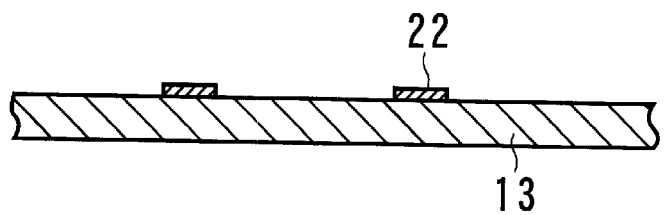
FIGS. 1 (a)–(c) is a diagram showing an example of use of an adhesive of the present invention.

Various numeral references represent the following elements: 11, semiconductor chip; 12, 15, adhesive; 13, wiring board; 5, 6, electric device; $P_1$, first temperature; $P_2$, second temperature.

DETAILED DESCRIPTION OF PREFERRED EMBODIMENTS OF THE INVENTION

Adhesives for connecting a semiconductor chip to a wiring board include thermoplastic resins and thermosetting resins, and in either case, the glass transition point of the adhesive must be higher than the temperature range within which the semiconductor chip is used to prevent separation of the semiconductor chip.

We found that when thermosetting resins having a single backbone forming a three-dimensional network are used, the temperature dependency of the elastic modulus is governed by the single backbone so that the elastic modulus monotonically varies to increase the stress on the semiconductor chip. This seems to mean that the stress can be reduced if a temperature is established at which the elastic modulus loss of the adhesive sharply increases within the working temperature range while maintaining the three-dimensional network.

The present invention was made on the basis of the above finding and provides an adhesive used for connecting a semiconductor chip and a wiring board, comprising a first resin component which is polymerizable, a first hardener for inducing a self-polymerization reaction of the first resin component, and a second hardener which is addition-polymerized with the first resin component. As discussed below, a second resin component that is polymerized separately from the first resin component may optionally be included in the adhesive.

According to the structure of the present invention as defined above, the first resin component is self-polymerized with the aid of the first hardener to form a three-dimensional network. The second hardener is addition-polymerized with the network. As a result, the elastic modulus gradient with respect to temperature sharply changes at two temperatures, i.e., a first temperature and a second temperature higher than the first temperature, because the adhesive shows different glass transition points in the initial network zone and the network zone resulting from the addition polymerization.

In the temperature range except for the first and second temperatures and their surroundings, the elastic modulus gradient is almost constant and the elastic modulus decreases with an increase in temperature.

When the adhesive is heated, the elastic modulus decreases with temperature rise, and when the first temperature is exceeded, the addition polymerization zone becomes rubbery so that the elastic modulus sharply decreases. Therefore, the stress does not much increase at or higher than the first temperature.

So far as the temperature Is lower than the second temperature even if it is heated above the first temperature, the three-dimensional network zone formed by self-polymerization maintains a glass state so that the bonding power is not deteriorated and the semiconductor chip is not separated from the wiring board.

The adhesive of the present invention can be inserted between a semiconductor chip and a wiring board and cured by a heat treatment to form an electric device having the semiconductor chip and the wiring board. Embodiments of the present invention are described below.

Initially, an adhesive of the present invention was prepared by blending a first resin component which is polymerizable, a first hardener for inducing a self-polymerization reaction of the first resin component, and a second hardener which is addition-polymerized with the first resin component. This adhesive is pasty, i.e., having the characteristics of a paste.

Figure 1B:
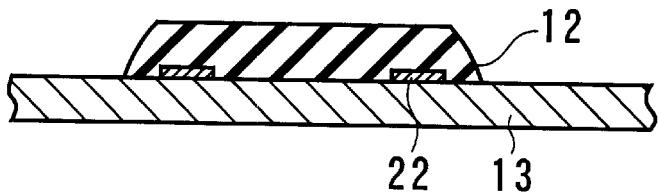
Figure 1C:
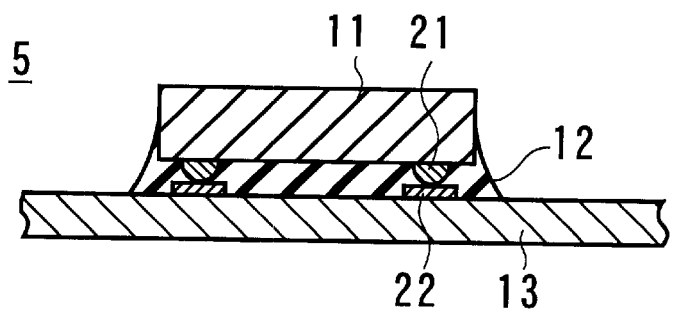

Reference 13 in FIG. 1 (*a*) represents a wiring board having a copper wiring on the surface, and parts of the copper wiring form connection terminals 22. A given amount of the adhesive is applied over the connection terminals 22. Reference 12 in FIG. 1 (*b*) represents the adhesive thus applied.

Reference 11 in FIG. 1 (*c*) represents a semiconductor chip. On one side of the semiconductor chip 11 are formed bump-like connection terminals 21 connected to the inner circuit. The side of the semiconductor chip 11 having the connection terminals 21 is pressed against the adhesive 12 to contact the connection terminals 22 on the wiring board 13 and the connection terminals 21 on the semiconductor chip 11. When heat is applied to cure the adhesive 12, the semiconductor 11 is bonded to the wiring board 13 with the connection terminals 21, 22 of the semiconductor chip 11 and the wiring board 13 being electrically connected to each other, whereby an electric device 5 of the present invention is obtained.

Although the above adhesive was pasty, adhesives of the present invention also include self-supportably semicured film-like adhesives and film-like adhesives containing a solid resin.

Figure 2A:
FIGS. 2 (a)–(c) is a diagram showing another example of use of an adhesive of the present invention.
Figure 2B:
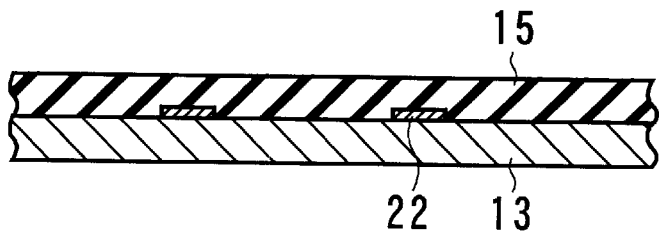
Figure 2C:
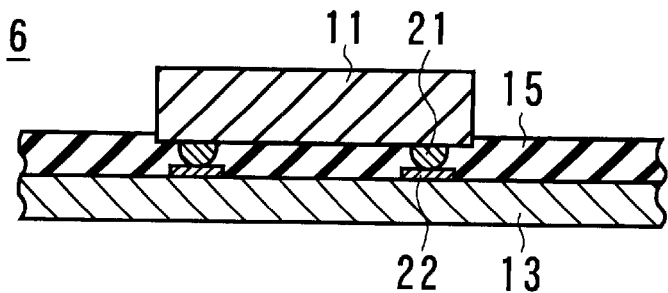

Reference 15 in FIG. 2 (*a*) represents an example of a film-like adhesive according to the present invention. The adhesive 15 is initially applied on the side of a wiring board 13 having connection terminals 22 as shown in FIG. 2(*b*) and then a wiring board 11 is applied on the surface of adhesive 15 to contact the connection terminals 22 on the wiring board 13 and the connection terminals 21 on semiconductor chip 11 as shown in FIG. 2 (*c*). The adhesive 15 is then cured by a heat treatment, whereby an electric device 6 is obtained.

Figure 3:
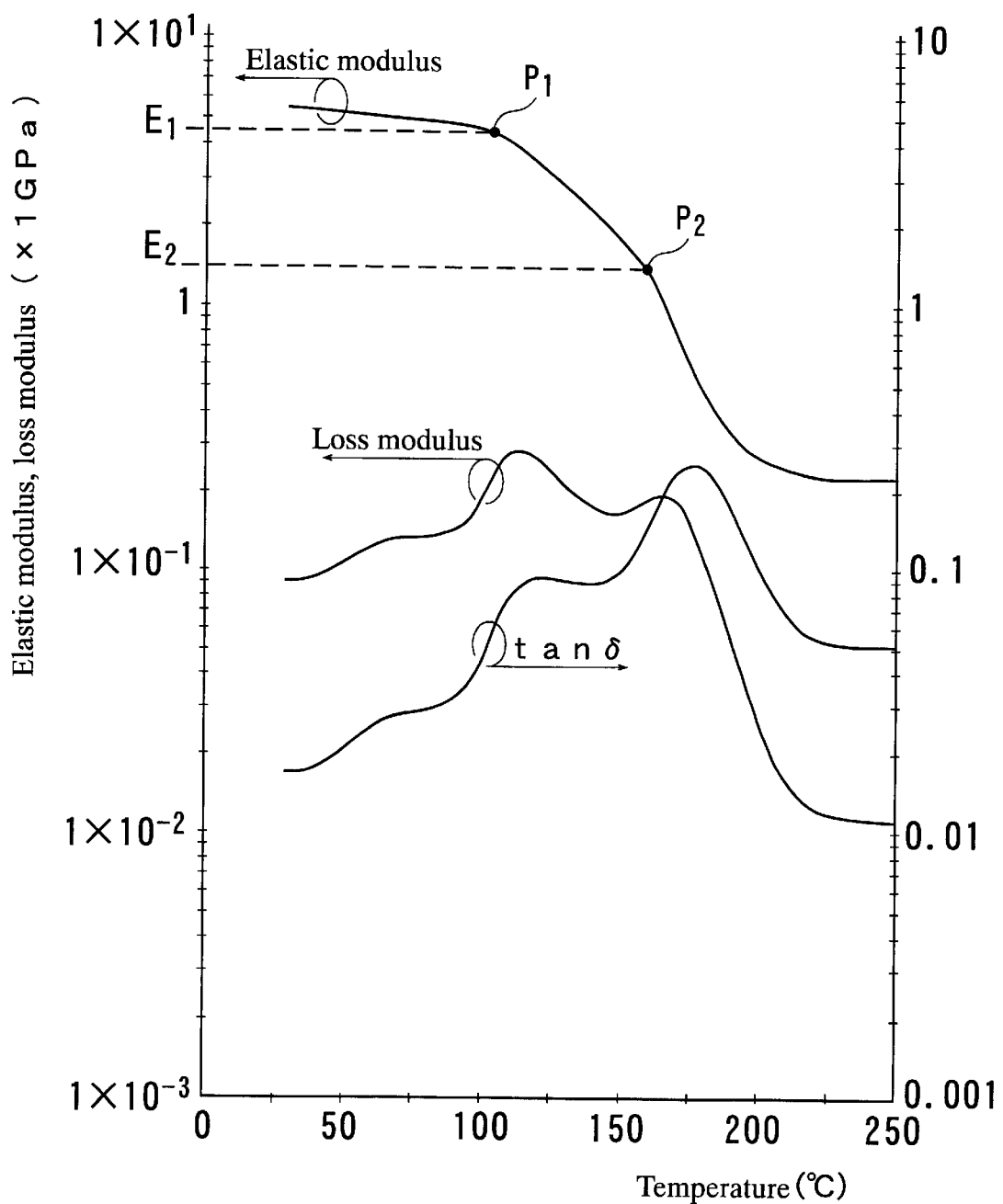
FIG. 3 is a graph showing the relation of the elastic modulus, loss elastic modulus and loss tangent with temperature change.
Figure 4:
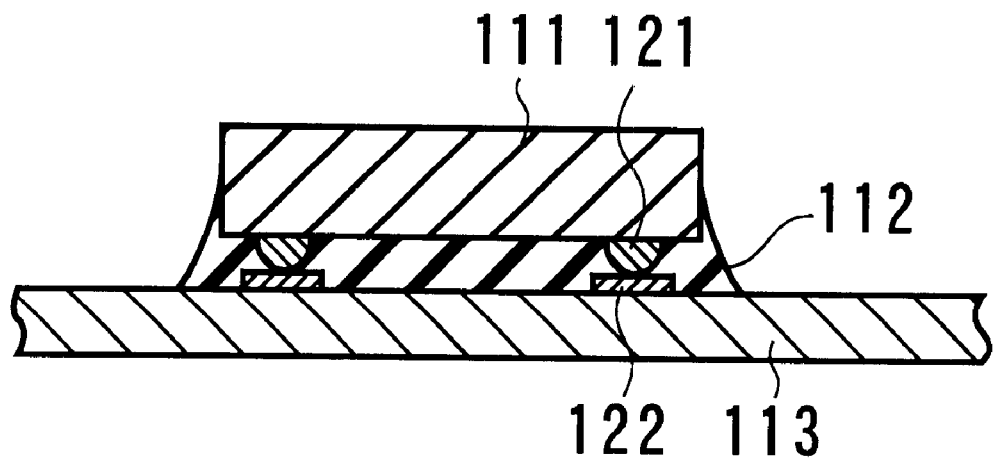
FIG. 4 is a diagram for illustrating an adhesive of the prior art.

FIG. 3 is a graph showing the relation of the elastic modulus, loss modulus and tan δ with the temperature of an adhesive according to an example of the present invention. The adhesive contains 20 parts by weight of an epoxy resin ("HP4032D" from Dainippon Ink & Chemicals, Incorporated) as a first resin component which is polymerizable, 15 parts by weight of an epoxy-dispersing imidazole hardener ("HX3941HP" from Asahi Chemical Industry Co., Ltd.) as first hardener for inducing a self-polymerization reaction of the first resin component, 5 parts by weight of a phenol hardener ("VH4170" from Dainippon Ink & Chemicals, Incorporated) as second hardener which is addition-polymerized with the first resin component, 10 parts by weight of a phenoxy resin ("YP50" from Tohto Kasei Co. Ltd.) as a second resin component incapable of reacting with epoxy resins, and 45 parts by weight of silica as a filler.

When the adhesive is heated, the elastic modulus loss (the gradient of the curve representing elastic modulus change vs. temperature change) sharply increases at a first temperature $P_1$ of about 100° C., and then the elastic modulus loss further increases at a second temperature $P_2$ of about 160° C. The elastic modulus loss is almost constant between room temperature and the first temperature $P_1$, between the first temperature $P_1$ and second temperature $P_2$, and between the second temperature $P_2$ and 200° C.

When the first resin component consists of an epoxy resin, suitable first hardeners for inducing self-polymerization of the first resin component other than imidazole hardeners include tertiary amines and Lewis acid catalysts. Suitable second hardeners which are addition-polymerized with the first resin component include active hydrogen-containing amine hardeners, phenol hardeners, hydrazide hardeners, mercapto hardeners, dicyandiamide hardeners, etc.

Resins of the present invention are desirably cured for a short period in terms of the production efficiency. For example, the resins may preferably be heated at a temperature of from 180° C. or more to 250° C. or less for a period of from 5 seconds or more to 20 seconds or less. Therefore, the second temperature $P_2$ is desirably at least 130° C. or more. In order that no residual stress may remain after curing in a reflow furnace, the elastic modulus is desirably 0.5 GPa or less at a maximum temperature during heating. For example, the elastic modulusis desirably from 0.5 GPa or less to 0.1 GPa or more at 250° C.

Adhesives of Examples 1–6 and Comparative example 1 having the compositions shown in Table 1 below were prepared.

TABLE 1

Resins and hardeners used

| | Example 1 | Example 2 | Example 3 | Example 4 | Example 5 | Example 6 | Comparative Example 1 |
|---|---|---|---|---|---|---|---|
| Minor resin component YP50 | 10 | 10 | 10 | 10 | 20 | 10 | 10 |
| Major resin component HP4032D | 20 | 20 | 20 | — | 10 | 20 | 20 |
| Major resin component EP828 | — | — | — | 20 | — | — | — |
| Filler silica | 45 | 45 | 45 | 45 | 45 | 50 | 45 |
| Minor hardener DICY | — | 1.5 | — | — | — | — | — |
| Minor hardener VH4170 | 5 | — | 5 | 5 | 5 | 5 | — |
| Major hardener HX3941HP | 15 | 15 | 15 | 15 | 15 | 15 | 15 |
| Conductive particles 20GNR | 21 | 21 | — | 21 | 21 | 21 | 21 |

YP50 . . . a phenoxy resin from Tohto Kasei Co., Ltd.
HP4032D . . . an epoxy resin having an epoxy equivalent of 140 g/eq from Dainippon Ink & Chemicalse, Incorporated
EP828 . . . an epoxy resin having an epoxy equivalent of 190 g/eq from Yuka Shell Epoxy Kabushiki Kaisha
DICY . . . a dicyandiamide hardener having an active hydrogen equivalent of 21 g/eq from Nippon Carbide Industries Co., Inc.
VH4170 . . . a phenol hardener having an active hydrogen equivalent of 118 g/eq
HX3941HP . . . an epoxy-dispersing imidazole hardener having an epoxy equivalent of 280 g/eq from Asahi kasei Co., Ltd.
20GNR . . . a metal-coated resin particle from Nippon Chemical Industrial Co., Ltd.

HP4032D and EP828 are first resin components of the present invention which are polymerizable, and HX3941HP is a first hardener for inducing a self-polymerization reaction of the first resin components. DICY and VH4170 are second hardeners which are addition-polymerized with the first resin components. YP50 is a second resin component which is polymerized separately from the first resin components. Comparative example 1 does not contain any second hardener.

Adhesives of the Examples 1–6 and Comparative example 1 are in the form of a film, and a semiconductor chip 11 specially prepared for connection testing was put on a wiring board 13 made of a glass epoxy substrate to bond them under conditions of 180° C.×20 seconds. The load applied during then was 100 g per a connection terminal 21 on the semiconductor chip 11. The semiconductor chip 11 used was a silicon chip of 10 mm square.

Separately, adhesive films of Example 1–6 and Comparative example 1 were cured by heating at a temperature of 200° C. for 5 minutes, and then cut out into a test piece of 2 mm×5 cm×50 μm in thickness. The semiconductor chip 11 was applied on the wiring board 13 via the test piece, and the assembly was left in an atmosphere of 30° C., RH 70% for 192 hours and then passed through a reflow furnace so that it was heated at a maximum temperature of 240° C. to cure the adhesive.

The test piece was measured for its loss tangent (tan δ) and elastic modulus at 250° C., the first and second temperatures $P_1$, $P_2$ at which the elastic modulus gradient sharply changes upward, and the moduli at the first and second temperatures $P_1$, $P_2$. Loss tangent (tan δ), loss modulus, and elastic modulus were measured according to JIS K 7198-1991 (now JIS K 7244-4:01999), incorporated herein by reference.

Wiring board 13 connected to semiconductor chip 11 was subjected to a temperature cycle test (TCT) and a pressure cooker test (PCT).

The results are shown in Table 2 below.

TABLE 2

Measurement results

| | Example 1 | Example 2 | Example 3 | Example 4 | Example 5 | Example 6 | Comparative Example 1 |
|---|---|---|---|---|---|---|---|
| Lower-side temperature at which tan δ peaks | 111 | 120 | 110 | 107 | 105 | 113 | 160 |
| Higher-side temperature at which tan δ peaks | 181 | 175 | 180 | 165 | 178 | 180 | Not exist |
| Elastic modulus at 250° C. | 0.21 | 0.18 | 0.23 | 0.07 | 0.12 | 0.25 | 0.29 |
| First temperature $P_1$ | 103 | 105 | 102 | 98 | 96 | 104 | 118 |
| Elastic modulus $E_1$ | 4.3 | 3.3 | 4.1 | 4.2 | 4.0 | 4.5 | 4.0 |

TABLE 2-continued

Measurement results

| | Example 1 | Example 2 | Example 3 | Example 4 | Example 5 | Example 6 | Comparative Example 1 |
|---|---|---|---|---|---|---|---|
| at First temperature $P_1$ | | | | | | | |
| Second temperature $P_2$ | 160 | 153 | 161 | 135 | 157 | 162 | — |
| Elastic modulus $E_2$ at Second temperature $P_2$ | 1.2 | 1.2 | 1.1 | 1.2 | 1.0 | 1.4 | — |
| $E_1/E_2$ | 3.6 | 2.8 | 3.7 | 3.5 | 4.0 | 3.2 | — |
| TCT cycle | 1000 < | 1000 < | 850 | 762 | 435 | 525 | 15 |
| PCT 300 h | Good | Good | Good | Good | Good | Good | Not good |

Test piece . . . 2 mm × 5 cm, 50 μm in thickness
Frequency at which the loss tangent was measured . . . 11 Hz
Moisture adsorption condition . . . 30° C. RH 70%, 192 hours
Reflow temperature . . . maximum 240° C.
TCT conditions . . . −55° C./125° C.
PCT conditions . . . 121° C., 2.1 atm, RH 100%

As shown in Table 2 above, Examples 1–6 gave a reliability several tens of times higher than that of Comparative example 1 in the temperature cycle test, and the result of the pressure cooker test for 300 hours in Comparative example 1 was poor due to the failure of electric connection between connection terminals 21, 22 of the semiconductor chip 11 and the wiring board 13 in contrast to Examples 1–6, which were all assessed as good because electric connection was maintained.

The ratio $E_1/E_2$ of the elastic modulus $E_1$ at the first temperature $P_1$ to the elastic modulus $E_2$ at the second temperature $P_2$ was 2.8 or more in adhesives of the present invention as shown in Table 2. This presumably means that the temperature cycle test (TCT) can be passed if the $E_1/E_2$ value is 2.8 or more.

Although metal-coated resin particles were used as conductive particles in each of the above examples, metal particles may also be used. The conductive particles need not be present as demonstrated by Example 3.

Although silica was used as filler in the above examples, other fillers such as alumina or titanium oxide may also be used. Although a phenoxy resin was used as second resin component which is polymerized separately from the first resin component, other types of resin such as polyester resins, acrylic resins or urethane resins may also be used. The second resin component need not be present in the adhesive. Additives such as coupling agents may be added, if desired.

For forming the adhesive of the present invention into the form of sheet, the adhesive of the present invention may be applied on a flat board etc. and heated to be semicured at 10% to 40% cure rate.

Through the use of the adhesive of the present invention a highly reliable electric device can be obtained in which the elastic modulus loss changes at two stages to reduce the stress on the semiconductor chip.

What is claimed is:

1. An adhesive for connecting a semiconductor chip and a wiring board, comprising a first resin component that is an epoxy which is polymerizable, a first hardener for inducing a self-polymerization reaction of the first resin component, and a second hardener which is addition-polymerized with the first resin component, wherein the adhesive after curing has an elastic modulus decreasing with an increase in temperature, and wherein an elastic modulus loss sharply increases at both of a first temperature of from higher than 30° C. to lower than 150° C. and a second temperature within a range of from 130° C. or more to 250° C. or less and higher than the first temperature.

2. The adhesive of claim 1 wherein a difference between the first temperature and the second temperature is 40° C. or more.

3. The adhesive according to claim 1 wherein a ratio of an elastic modulus at the first temperature to an elastic modulus at the second temperature is 2.8 or more.

4. The adhesive according to claim 1 wherein the first hardener is one or more of an imidazole, a tertiary amine or a Lewis acid catalyst.

5. The adhesive according to claim 1 wherein the second hardener is one or more of an active hydrogen-containing amine, a phenol, a hydrazide, a mercapto or a dicyandiamide hardener.

6. An adhesive for connecting a semiconductor chip and a wiring board, comprising a first resin component that is an epoxy which is polymerizable, a first hardener for inducing a self-polymerization reaction of the first resin component, a second hardener which is addition-polymerized with the first resin component, and conductive particles.

7. An adhesive for connecting a semiconductor chip and a wiring board, comprising a first resin component that is an epoxy which is polymerizable, a first hardener for inducing a self-polymerization reaction of the first resin component, a second hardener which is addition-polymerized with the first resin component, and a filler of silica, alumina or titanium oxide.

8. The adhesive of claim 1 wherein the adhesive further contains a second resin component that is a phenoxy which is polymerized separately from the first resin component.

9. The adhesive of claim 1 wherein the adhesive is preliminarily semicured and formed into a sheet.

10. An electric device comprising a semiconductor chip and a wiring board, wherein the semiconductor chip is adhesively bonded to the wiring board with an adhesive, wherein the adhesive comprises a first resin component that is an epoxy which is polymerizable, a first hardener for inducing a self-polymerization reaction of the first resin component, and a second hardener which is addition-polymerized with the first resin.

11. The electric device according to claim 10 wherein the semiconductor chip includes connection terminals that contact connection terminals of a wiring pattern on the wiring board.

* * * * *